US008816465B1

(12) United States Patent
Gardner et al.

(10) Patent No.: US 8,816,465 B1
(45) Date of Patent: Aug. 26, 2014

(54) ENERGY CONVERSION AND STORAGE DEVICE AND MOBILE ELECTRONIC DEVICE CONTAINING SAME

(71) Applicants: Donald S. Gardner, Los Altos, CA (US); Cary L. Pint, Nashville, TN (US)

(72) Inventors: Donald S. Gardner, Los Altos, CA (US); Cary L. Pint, Nashville, TN (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 13/773,849

(22) Filed: Feb. 22, 2013

(51) Int. Cl.
*H01L 31/02* (2006.01)
*H01G 11/26* (2013.01)

(52) U.S. Cl.
CPC .......... *G01L 31/02021* (2013.01); *H01G 11/26* (2013.01)
USPC .......................................... 257/461; 257/464

(58) Field of Classification Search
CPC ............. H01G 11/26; H01L 31/02008; H01L 31/02021; H02J 7/0052
USPC .................................................. 257/461, 464
See application file for complete search history.

(56) References Cited

U.S. PATENT DOCUMENTS

| | | | |
|---|---|---|---|
| 5,635,419 A | 6/1997 | Geiss et al. | |
| 5,748,438 A | 5/1998 | Davis et al. | |
| 6,751,085 B1 | 6/2004 | Huntington | |
| 6,805,998 B2 * | 10/2004 | Jenson et al. | 429/162 |
| 6,833,983 B2 | 12/2004 | Nguyen et al. | |
| 7,050,291 B2 | 5/2006 | Narendra et al. | |
| 7,324,328 B2 | 1/2008 | Narendra et al. | |
| 7,393,604 B2 | 7/2008 | Rocke et al. | |
| 7,404,887 B2 | 7/2008 | Katsir et al. | |
| 7,541,782 B2 | 6/2009 | Narendra et al. | |
| 7,794,510 B1 * | 9/2010 | Hopper et al. | 29/623.1 |
| 7,835,136 B2 | 11/2010 | Feaver et al. | |
| 2001/0032666 A1 * | 10/2001 | Jenson et al. | 136/256 |
| 2003/0086238 A1 | 5/2003 | Bendale et al. | |
| 2003/0165741 A1 | 9/2003 | Maly-Schreiber et al. | |
| 2004/0070921 A1 | 4/2004 | Ikeda et al. | |

(Continued)

FOREIGN PATENT DOCUMENTS

| | | |
|---|---|---|
| JP | 10-321481 A | 12/1998 |
| WO | 2005/022568 A1 | 3/2005 |
| WO | 2011/123135 A1 | 10/2011 |
| WO | 2013/048465 A1 | 4/2013 |

OTHER PUBLICATIONS

Desplobain et al., "Investigations on Porous Silicon as Electrode Material in Electrochemical Capacitors", phys. stat. sol., vol. 4, Issue 6, May 2007, pp. 2180-2184.

(Continued)

*Primary Examiner* — Allan R Wilson
(74) *Attorney, Agent, or Firm* — Kenneth A. Nelson

(57) ABSTRACT

An energy conversion and storage device includes an energy storage component (530, 601) including a first electrode (611) having a first plurality of channels (612) formed in a first region (615) of a first material (617), a second electrode (621) adjacent to but electrically isolated from the first electrode and having a second plurality of channels (622) formed in a first region (625) of a second material (627), and an electrolyte (650) within the first and second pluralities of channels. The first electrode forms a first interface (619) with the electrolyte and the second electrode forms a second interface (629) with the electrolyte. The energy conversion and storage device further includes a photovoltaic component (520, 602) formed in a second region of the first material.

19 Claims, 4 Drawing Sheets

(56) References Cited

U.S. PATENT DOCUMENTS

| | | | |
|---|---|---|---|
| 2004/0090735 A1 | 5/2004 | Kimura et al. | |
| 2004/0228055 A1 | 11/2004 | Pearson | |
| 2005/0052169 A1 | 3/2005 | Thrap | |
| 2005/0262675 A1 | 12/2005 | Sun | |
| 2006/0021649 A1 | 2/2006 | Kuroda et al. | |
| 2006/0130300 A1 | 6/2006 | Kobayashi et al. | |
| 2007/0002525 A1 | 1/2007 | Yamanoi et al. | |
| 2007/0076349 A1 | 4/2007 | Dementiev et al. | |
| 2007/0177332 A1 | 8/2007 | Kobayashi et al. | |
| 2008/0013224 A1 | 1/2008 | Kim et al. | |
| 2011/0075324 A1 | 3/2011 | Singh | |
| 2011/0149476 A1 | 6/2011 | Saida et al. | |
| 2011/0151324 A1* | 6/2011 | Chiang et al. | 429/210 |
| 2011/0242730 A1 | 10/2011 | Zhou et al. | |
| 2012/0008253 A1 | 1/2012 | Kuroda et al. | |
| 2012/0048357 A1* | 3/2012 | Hayase et al. | 136/255 |
| 2013/0136996 A1* | 5/2013 | Lee et al. | 429/231.8 |

OTHER PUBLICATIONS

PCT Patent Application No. PCT/US2011/054372, filed on Sep. 30, 2011, 33 pages.

PCT Patent Application No. PCT/US2011/059211, filed on Nov. 3, 2011, 34 pages.

PCT Patent Application No. PCT/US2011/064013, filed on Dec. 8, 2011, 37 pages.

PCT Patent Application No. PCT/US2011/067434, filed on Dec. 27, 2011, 31 pages.

PCT Patent Application No. PCT/US2011/066650, filed on Dec. 21, 2011, 34 pages.

PCT Patent Application No. PCT/US2011/064969, filed on Dec. 14, 2011, 35 pages.

PCT Patent Application No. PCT/US2012/031719, filed on Mar. 30, 2012, 38 pages.

PCT Patent Application No. PCT/US2011/068046, filed on Dec. 30, 2011, 18 pages.

PCT Patent Application No. PCT/US2011/067485, filed on Dec. 28, 2011, 21 pages.

PCT Patent Application No. PCT/US2012/025973, filed on Feb. 21, 2012, 29 pages.

PCT Patent Application No. PCT/US2012/034972, filed on Apr. 25, 2012, 32 pages

U.S. Appl. No. 13/621,354, filed Sep. 17, 2012, 40 pages

U.S. Appl. No. 13/631,579, filed Sep. 28, 2012, 57 pages.

U.S. Appl. No. 13/584,488, filed Aug. 13, 2012, 31 pages

U.S. Appl. No. 13/711,531, filed Dec. 11, 2012, 37 pages.

U.S. Appl. No. 13/730,324, filed Dec. 28, 2012, 30 pages.

International Search Report and Written Opinion received for PCT Patent Application No. PCT/US2011/054372, mailed on May 2, 2012, 10 pages.

International Search Report and Written Opinion received for PCT Patent Application No. PCT/US2011/059211, mailed on Jul. 9, 2012, 10 pages.

International Search Report and Written Opinion received for PCT Patent Application No. PCT/US2011/064013, mailed on Aug. 28, 2012, 9 pages.

International Search Report and Written Opinion received for PCT Patent Application No. PCT/US2011/067434, mailed on Sep. 10, 2012, 10 pages International Search Report and Written Opinion received for PCT Patent Application No. PCT/US2011/066650, mailed on Sep. 17, 2012, 10 pages International Search Report and Written Opinion received for PCT Patent Application No. PCT/US2011/064969, mailed on Sep. 17, 2012, 9 pages International Search Report and Written Opinion received for PCT Patent Application No. PCT/US2012/031719, mailed on Nov. 28, 2012, 10 pages.

International Search Report and Written Opinion received for PCT Patent Application No. PCT/US2011/067485, mailed on Sep. 12, 2012, 9 pages.

International Search Report and Written Opinion received for PCT Patent Application No. PCT/US2012/034972, mailed on Dec. 27, 2012, 12 pages.

Anonymous,"Method for super capacitor stacking", IDF #32890, published as IPCOM000100600D, Mar. 15, 2005, 4 pages.

International Search Report and Written Opinion received for PCT Patent Application No. PCT/US2012/025973, mailed on Jan. 31, 2013, 9 pages.

* cited by examiner

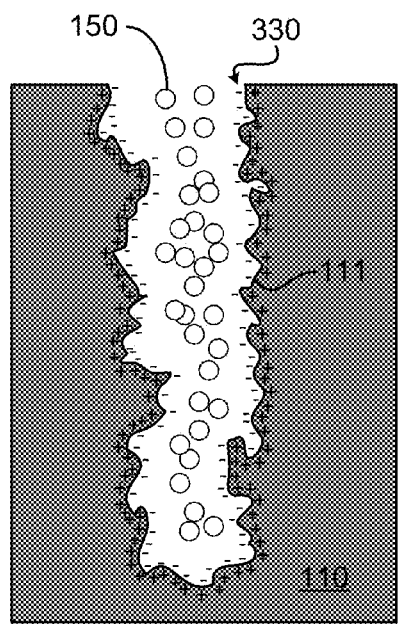
FIG. 3
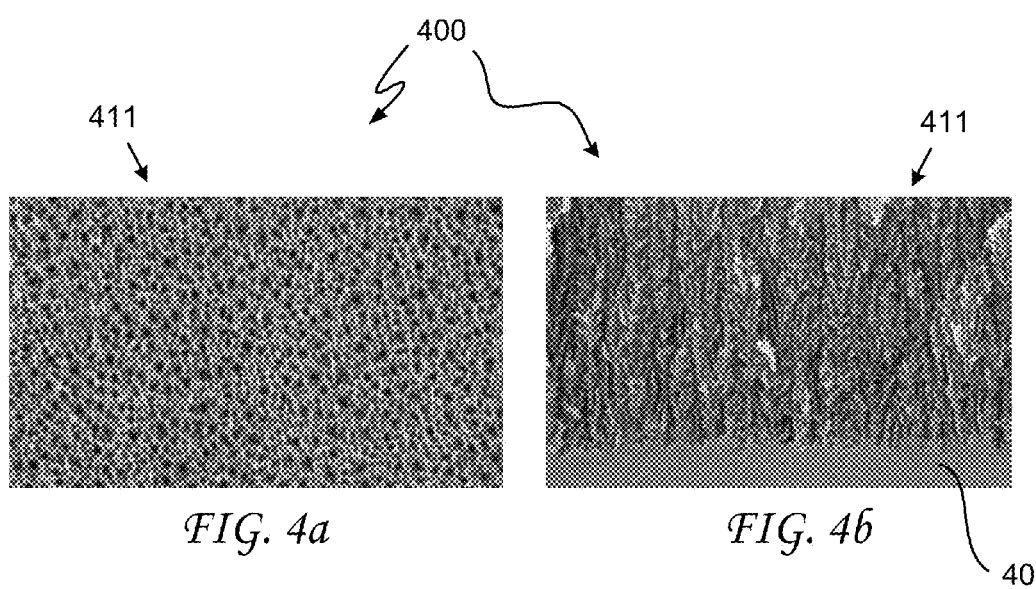
FIG. 4a
FIG. 4b

ENERGY CONVERSION AND STORAGE DEVICE AND MOBILE ELECTRONIC DEVICE CONTAINING SAME

FIELD OF THE INVENTION

The disclosed embodiments of the invention relate generally to energy storage, and relate more particularly to electrochemical devices that collect and store energy.

BACKGROUND OF THE INVENTION

Modern societies depend on the ready availability of energy. As the demand for energy increases, devices capable of efficiently storing energy become increasingly important. As a result, energy storage devices, including batteries, capacitors, electrochemical capacitors (ECs), (including pseudocapacitors and electric double-layer capacitors (EDLCs) (sometimes called ultracapacitors or supercapacitors, among other names)), hybrid ECs, and the like are being extensively used in the electronics realm and beyond. In particular, capacitors are widely used for applications ranging from electrical circuitry and power delivery to voltage regulation and battery replacement. Electrochemical capacitors are characterized by high energy storage capacity, rapid charge/discharge ability, and large cycle lifetimes, as well as other desirable characteristics including high power density, small size, and low weight, and have thus become promising candidates for use in several energy storage applications.

BRIEF DESCRIPTION OF THE DRAWINGS

The disclosed embodiments will be better understood from a reading of the following detailed description, taken in conjunction with the accompanying figures in the drawings in which:

FIG. 3 is a depiction of an electric double layer formed within a channel of a porous structure according to an embodiment of the invention;

FIGS. 4a and 4b are images of, respectively, a surface and a cross-sectional slice of a porous silicon structure;

Figure 1:
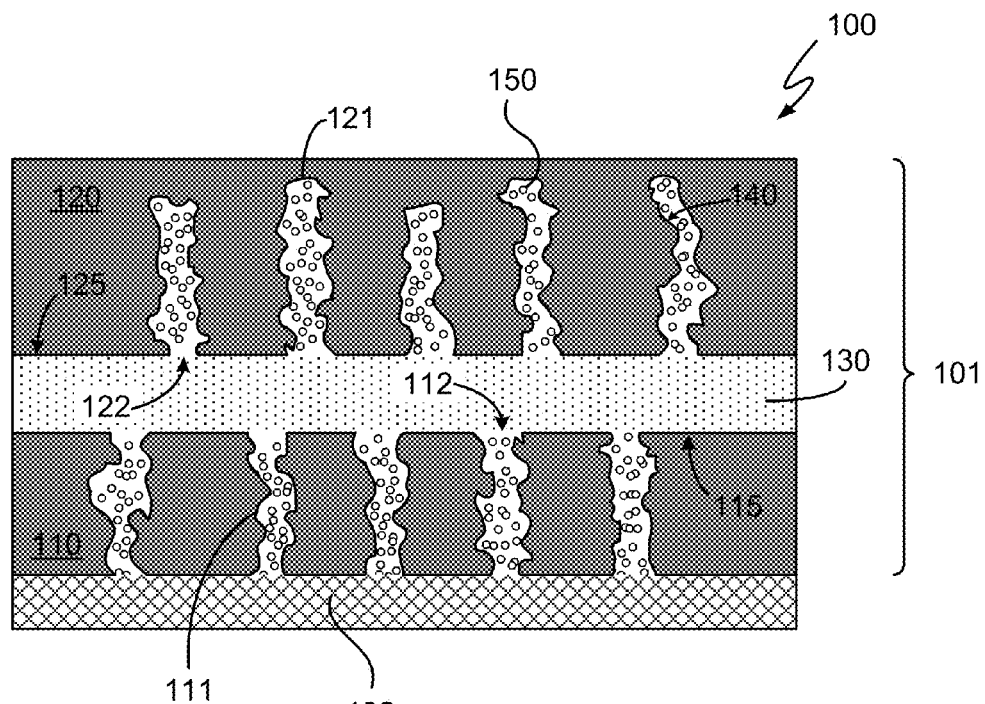
FIGS. 1 and 2 are cross-sectional views of an energy storage structure according to embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an energy conversion and storage device comprises an energy storage component comprising a first electrode having a first plurality of channels formed in a first region of a first material, a second electrode adjacent to but electrically isolated from the first electrode and having a second plurality of channels formed in a first region of a second material, and an electrolyte within the first and second pluralities of channels. The first electrode forms a first interface with the electrolyte and the second electrode forms a second interface with the electrolyte. The energy conversion and storage device further comprises a photovoltaic component formed in a second region of the first material.

Solar cells (also known as photovoltaic (PV) devices) directly convert light into electricity, and usually use physics and technology similar to that used by the microelectronics industry. A typical solar cell is composed of a thick light-absorbing layer and a p-n junction that enables the harvesting of photo-generated electrons. These materials are typically coated with transparent conducting oxides and have an efficiency that is determined by the amount of light absorbed versus the number of resulting electron-hole pairs that are converted to usable charge.

Silicon is a widely-used material in conventional solar cells because it has optical properties that are nearly optimal in terms of enabling maximum efficiency in a Generation I-type solar device (which is typically more cost-effective than second- or third-generation devices). Embodiments of the invention take advantage of this property by integrating a solar cell with various electrochemical devices that use silicon as the material for at least one of their electrodes. At the same time, many materials besides silicon may also be used for both solar cells and electrochemical devices—some of which may be even better suited for certain applications than silicon would be—and any of these materials (examples of which will be given below) may be used to advantage in various embodiments of the invention.

In a typical solar cell, the absorption of light into the material (determined by the Beer-Lambert relation) follows an exponential trend with thickness. Therefore, the active material for absorption of solar radiation is only a few microns of material on the surface of the solar device. Accordingly, since conventional silicon wafer processing typically involves wafer thicknesses in the range of 100-200 micrometers (hereinafter "microns," or "$\mu m$") it is highly attractive to utilize the inactive material in the solar cell (which will likely always be present due to the high cost of ultra-thin materials) as a medium for storing energy and improving the functionality of the materials in the solar cell.

Existing solar cells are used to convert photons into electrical energy and then are used to supply energy directly to an electrical device or to feed it back into the electrical grid. Unfortunately, this approach only supplies energy intermittently, that is, when sunlight is available. In addition, the electrical grid can only act as a storage unit for a limited amount of energy before the cost exceeds the benefit and additional storage has to be added. Furthermore, existing solar devices and energy storage devices are produced in separate processing routes, making their integration only possible by combining two isolated device structures. Embodiments of the invention overcome the foregoing issues by integrating the structures.

Although much of the discussion herein that is directed toward energy storage devices (or toward energy storage components of more comprehensive or multi-functional devices) will focus on electrochemical capacitors, the "energy storage device" and "energy storage component" designations explicitly include—in addition to ECs—hybrid electrochemical capacitors (which, like electrochemical capacitors, are discussed in more detail below) as well as batteries, fuel cells, and similar devices that store energy. Energy storage devices/components according to embodiments of the invention can be used for a wide variety of applications, including in personal computers (PCs), including desktop and laptop (notebook) computers, tablet computers, cell phones, smart phones, music players, servers, other electronic devices, automobiles, buses, trains, airplanes, other transportation vehicles, home energy storage, storage for energy generated by solar or wind energy generators—especially energy harvesting devices—and many others.

Electrochemical capacitors operate according to principles similar to those that govern conventional parallel plate capacitors, but certain important differences do apply. One significant difference concerns the charge separation mechanism. For one important class of ECs this typically takes the form of a so-called electric double layer, or EDL, rather than the dielectric of a conventional capacitor. The EDL is created at an interface between an electrolyte and a high-surface area electrode by the electrochemical behavior of electrons (or electronic holes) on one side of the interface and ionic charge carriers on the other side, and results in an effective separation of charge in spite of the fact that the two layers within the double layer are so close together. (Physical separation distances are on the order of a single nanometer.) Thus, a typical EDL capacitor may be thought of as storing charge in its EDL. Each layer of the EDL, which is formed when a voltage is applied across the interface, is electrically conductive—conduction is performed by ions in the electrolyte and by electrons/holes in the electrode—but the properties of the double layer prevent current from flowing across the boundary between them. (The EDL is further discussed below in connection with FIG. 3.)

As is true in conventional capacitors, capacitance in an EDL capacitor is proportional to the surface area of the electrodes and inversely proportional to the charge separation distance. The very high capacitances achievable in an EDL capacitor are due in part to the very high surface area attributable to the multi-channel porous structure and to the nanometer-scale charge separation distance attributable to the EDL, which arises due to the presence of an electrolyte, as explained above. One type of electrolyte that may be used in accordance with embodiments of the invention is an ionic liquid. Another is an electrolyte comprising an ion-containing solvent. Organic electrolytes, aqueous electrolytes, and solid-state electrolytes are also possible.

Another class of electrochemical capacitor is the pseudocapacitor, where, in addition to EDL capacitance, an additional storage mechanism—one that is Faradaic and not electrostatic in origin—can arise at the surface of certain types of electrodes. The additional storage mechanism is typically referred to as "pseudocapacitance," and is characterized by a charge storage process that is similar to the operation of many solid-electrode batteries. The two storage mechanisms complement each other, leading to even greater energy storage potential than is possible with EDL capacitance alone. Typically, one of the electrodes of a pseudocapacitor is coated with a transition metal oxide, a suitable conducting polymer, or a similar material that makes up the active material where charge is stored. These materials can be used with an electrolyte such as a potassium hydroxide (KOH) solution; when the device is charged, the electrolyte will react with the material and drive a charge transfer reaction where energy is stored. More specifically, these materials store most of their energy through highly-reversible surface and near-surface electron transfer (e.g., redox (Faradaic)) reactions, which enable higher power than bulk storage in conventional batteries due to the fast charge and discharge kinetics.

It will be understood that pseudocapacitors may be constructed using electrolytes other than the one mentioned above. For example, ion-containing solvents such as $Li_2SO_4$ or $LiPF_6$ may be used as the electrolyte; these result in an intercalation reaction that involves the insertion of a species into the surface of the host structure without breaking any bonds. This reaction, like the other pseudocapacitive reactions mentioned earlier, results in a transfer of charge so it too is Faradaic and considered a redox reaction (albeit a special type).

Hybrid electrochemical capacitors are energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Figure 2:
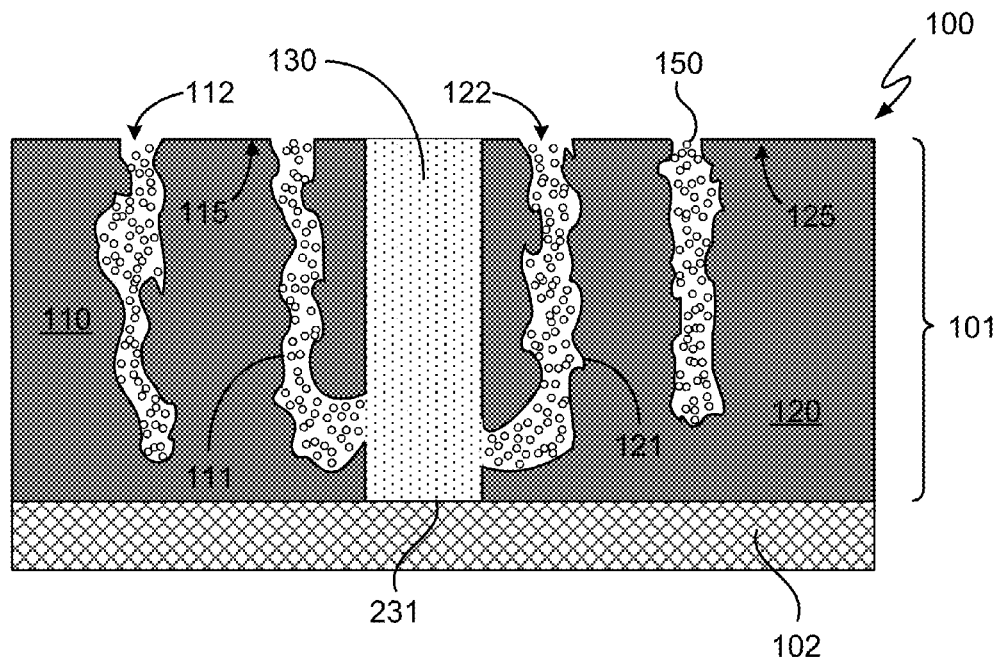

Referring now to the drawings, FIGS. 1 and 2 are cross-sectional views of an energy storage structure 100 that will be used to guide an initial discussion introducing concepts and structures that will aid in the understanding of embodiments of the present invention. As illustrated in FIG. 1, energy storage structure 100 comprises an energy storage device 101 and an electrically conductive support structure 102. (In some embodiments support structure 102 can be omitted.) Alternatively, as illustrated in FIG. 2, energy storage structure 100 comprises energy storage device 101 and a non-conductive support structure 102.

Energy storage device 101 comprises an electrically conductive structure 110 and an electrically conductive structure 120 separated from each other by a separator 130 that is an electron insulator and an ionic conductor. Separator 130 prevents electrically conductive structures 110 and 120 from physically contacting each other, thereby preventing an electrical short circuit. (In other embodiments, for reasons discussed below, a separator is not necessary and can be omitted.)

In some embodiments, at least one of electrically conductive structures 110 and 120 comprises a porous structure containing multiple channels, each one of which has an opening to a surface of the porous structure. This feature is a result of an exemplary process, described below, used to form the porous structure in certain embodiments. As an example, the porous structure may be formed within an electrically conductive or a semiconductive material. Alternatively, the porous structure may be formed within an insulating material (e.g., alumina) that has been coated with an electrically conductive film (e.g., an atomic layer deposition (ALD) conductive film such as titanium nitride (TiN), tungsten, or ruthenium). In this regard, materials having greater electrical conductivity are advantageous because they lower the energy storage device's effective series resistance (ESR). In the illustrated embodiments, both electrically conductive structure 110 and electrically conductive structure 120 comprise such a porous structure. Accordingly, electrically conductive structure 110 comprises channels 111 with openings 112 to a surface 115 of the corresponding porous structure and electrically conductive structure 120 comprises channels 121 with openings 122 to a surface 125 of the corresponding porous structure.

Various configurations of energy storage device 101 are possible. In the embodiment of FIG. 1, for example, energy storage device 101 comprises two distinct porous structures (that is, electrically conductive structure 110 and electrically conductive structure 120) that have been bonded together face-to-face with separator 130 in between. As another example, in the embodiment of FIG. 2 energy storage device 101 comprises a single planar porous structure in which a first section (electrically conductive structure 110) is separated from a second section (electrically conductive structure 120) by a trench 231 containing separator 130. One of the electrically conductive structures will be the positive side of the device and the other electrically conductive structure will be the negative side. Trench 231 may separate electrically conductive structure 110 and 120 along a straight line, but alternatively may separate them using a more complex shape such as the meandering space between the fingers of two interdigitated electrodes.

As an example, separator 130 could be a permeable membrane or other porous polymer separator. In general, the separator prevents the physical contact of anode and cathode (which could cause an electrical malfunction in the device) while permitting the transfer of ionic charge carriers. In addition to polymer separators, several other separator types are possible. These include non-woven fiber sheets or other non-woven separators, liquid membranes, polymer electrolytes, solid ion conductors, glass fiber, paper, ceramic, and the like. In some embodiments, non-woven separators are concentrations of fibers that are either randomly oriented or are arranged in a directional pattern.

It should be noted that the separator, although shown in FIG. 2, may not be necessary in the configuration illustrated there because, for example, support structure 102 could be used to maintain a physical separation between structures 110 and 120. As another example, electrically conductive structures 110 and 120 could each be attached to a ceramic package (not shown) that would keep the two electrically conductive structures physically separate from each other.

As an example, the porous structure of electrically conductive structures 110 and 120 can be created by a wet etch process in which a liquid etchant applied to a surface of the electrically conductive structures etches away portions of the electrically conductive structure in a way that is at least somewhat similar to the way water is able to carve channels in rock. This is why each one of the channels formed in this way has an opening to the surface of the electrically conductive structure: the wet etch method is incapable of creating fully-enclosed cavities, i.e., cavities within the porous structure that have no opening to the surface (like an air bubble trapped inside a rock). This is not to say that those openings cannot be covered with other materials or otherwise closed up because of the presence of or addition of other materials—that is in fact likely to occur in several embodiments—but, whether covered or not, the described openings to the surface are a feature of each channel in each porous structure according to at least one embodiment of the invention. (One embodiment in which the openings may be covered up is one in which a layer of epitaxial silicon as a location for circuitry or other wiring is grown on top of the channels).

With the right etchant, it should be possible to make porous structures having the described characteristics from a wide variety of materials. Silicon in various forms—including metallurgical grade silicon, monocrystalline silicon, polycrystalline silicon, and silicon on insulator—is one material that works well. As an example, a porous silicon structure may be created by etching a silicon substrate with a mixture of hydrofluoric acid (HF) and alcohol (ethanol, methanol, isopropyl, etc.). More generally, porous silicon and other porous structures may be formed by such processes as anodization and stain etching. Etching techniques according to embodiments of the invention will be discussed in more detail below. Some other materials (besides silicon) that may be especially well-suited for energy storage devices according to embodiments of the invention are porous germanium and porous tin.

Possible advantages of using porous silicon include its compatibility with existing silicon technology and its abundance in the earth's crust. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge, which is an undesirable result.) Porous germanium is also highly compatible with silicon technology. Possible advantages of using porous tin, which is a zero-band-gap material, include its enhanced conductivity with respect to certain other conductive and semiconductive materials.

Other materials may also be used for the porous structure, including semiconducting materials such as gallium arsenide (GaAs), indium phosphide (InP), boron nitride (BN), silicon carbide (SiC), and alloys such as an alloy of silicon and germanium. Organic semiconductors may also be used. In some embodiments the semiconducting materials—or even insulating materials—may be treated to make them electrically conductive (or more highly conductive). An example is silicon that is degenerately doped with boron. In addition to porous semiconducting substrates, porous conducting substrates may also be used for ECs, including, in certain embodiments, substrates composed of carbon or of metals such as copper, aluminum, nickel, calcium, tungsten, molybdenum, and manganese.

The etching used to make the porous structures may be accomplished using an electrochemical etch that makes use of a dilute mixture of HF and alcohol to form nanometer pores that can extend through a significant portion of the substrate. As an example, a porous structure such as porous semiconducting structure 110 or 120 may be prepared by applying an electrochemical etch technique to a solid silicon wafer having an initial resistivity of 0.7 milli-ohm centimeters (mΩ-cm) using as the etchant one of the HF mixtures referred to above. A current density in a range of approximately 25 milliamps per square centimeter (mA/cm$^2$) to 500 mA/cm$^2$ may be used. (The area component in these values refers to an area of the substrate surface before formation of the pores.)

The foregoing discussion has made reference to porous structures according to embodiments of the invention. These porous structures, as mentioned, can be formed within a variety of materials, including silicon (in various forms, including metallurgical grade silicon, monocrystalline silicon, polycrystalline silicon, and silicon on insulator), germanium, GaAs, InP, BN, CdTe, tin, copper, aluminum, nickel, calcium, tungsten, molybdenum, manganese, silicon carbide, organic semiconductors, and silicon-germanium alloys. The material from which the porous structure is made can, in at least some embodiments, be doped with elements that increase its conductivity; this may be done using standard techniques that are known in the art. In one embodiment, the material in which the porous structure is formed is silicon and the dopant species is boron, which may be introduced into the silicon in a concentration of, for example, $10^{19}$ atoms/cm$^3$. Other possible dopants include phosphorus and arsenic (though these and other n-type dopants require an illumination process during etching that p-type dopants do not).

Embodiments of the invention that rely on electrochemical etching as the channel creation technique have another reason for introducing dopants into the material from which the porous structure is to be made. Where silicon and an HF etchant are involved, it is thought that a high electric field attracts holes at defects and at the tip of the pores that aid the reaction between the silicon and the fluorine from the etchant. It is thought that the process involves the formation of SiF$_4$ molecules in liquid form. The SiF$_4$ gets pulled away and eventually gets washed out of the channels, leaving hydrogen atoms that bond to the sidewalls and also form H$_2$ that then bubbles away as a gas. Some hydrogen atoms remain; these bond with remaining silicon atoms. This process etches the channel (anisotropically) downward as opposed to expanding laterally in an isotropic manner (which would simply polish the surface without forming channels). Additional details, as best understood, are set forth below (though it must be said that precise details of the mechanism of porous silicon formation remain at least somewhat unclear).

In general terms, during channel formation, direct dissolution of the semiconductor almost always competes with oxidation plus subsequent dissolution of the oxide. The etchant (e.g., HF), therefore, has to be able to dissolve the oxide. A second prerequisite for the dissolution reaction and thereby channel formation in a semiconductor is the availability of electronic holes. The silicon surface, in contact with aqueous HF solutions, becomes saturated by hydrogen, depleted of electronic holes, and tends to be chemically inactive with respect to the electrolyte (this protects the channel sidewalls during the etching process). If a voltage is applied to the electrodes, the holes present in a silicon wafer start migrating towards the silicon-electrolyte interface. At the interface, a hole removes one silicon bond and thereby makes one silicon atom more susceptible for interactions with the electrolyte. Eventually, the silicon atom is transferred into the solution. The electrode decomposes into areas with optimal current density and channels are formed in areas with almost no current density. According to different models, initiation of the channel growth could begin at micro-cavities, structural defects, mechanically strained areas, or local perturbations of the surface potential field.

Referring again to FIGS. 1 and 2, energy storage structure 100 further comprises (in the embodiment illustrated in FIG. 1) an electrically conductive coating 140 on at least a portion of the porous structure and in at least some of channels 111 and/or channels 121. Such an electrically conductive coating may be necessary in order to maintain or enhance the conductivity of the porous structure, which can also lower the ESR, thereby improving performance. For example, a device having lower ESR is able to deliver higher power (which may be manifested in terms of greater acceleration, more horse power, etc.). In contrast, higher ESR (a condition that often prevails inside a typical battery) limits the amount of available energy, at least partially due to the fact that much of the energy is wasted as heat, which is a key consideration for both long-term performance and safety.

Illustrated in FIGS. 1 and 2 is an electrolyte 150, which gives rise to the EDL, as explained above. Electrolyte 150 (as well as the other electrolytes described herein) is represented in the drawings using a random arrangement of circles. This representation is intended to convey the idea that the electrolyte is a substance (liquid or solid, including gel-like materials) containing free ionic charge carriers. The circles were chosen for convenience and are not intended to imply any limitation as to the electrolyte components or qualities, including any limitation with respect to the size, shape, or number of the ionic charge carriers.

After the introduction of electrolyte 150, an electric double layer is formed within the channels of the porous structure, as depicted schematically in FIG. 3. In that figure, an electric double layer 330 has been formed within one of channels 111. EDL 330 is made up of two components: the electrical charge of the sidewalls of channel 111 (depicted as being positive in FIG. 3 but which in other embodiments could be negative); and the free ionic charge carriers in the electrolyte. EDL 330 thus provides a separation of charge that is necessary in order for the capacitor to function. As explained earlier, the large capacitance, and, hence, energy storage potential, of EDL capacitors arises in part due to the small (approximately 1 nanometer (nm)) separation distance between electrolyte ionic charge carriers and the electrode surface charge.

It should be noted that the FIG. 1 and FIG. 2 depictions of the porous structures are highly idealized in that, to mention just one example, all of channels 111 and 121 are shown as only extending vertically. In reality the channels may branch off in multiple directions to create a tangled, disordered pattern that may look something like the porous structure shown in FIGS. 4*a* and 4*b*.

FIGS. 4*a* and 4*b* are scanning electron microscope (SEM) images of, respectively, a surface and a cross-sectional slice of a porous structure 400 (in this case porous silicon). As illustrated, porous structure 400 contains multiple channels 411. It should be understood that channels 411 are likely to twist and turn along their lengths such that a single channel may have both vertical and horizontal portions as well as portions that are neither completely vertical nor completely horizontal but fall somewhere in between. Note that in FIG. 4b, the channels extend near to but do not quite reach a bottom of the etched structure, thus leaving a layer 402 of un-etched silicon underneath the channels. In one embodiment, un-etched layer 402 acts as a support structure for porous structure 400 (and for the corresponding energy storage device, not shown), and is thus the equivalent of support structure 102. In some embodiments, as mentioned above, the support structure may be omitted.

The foregoing discussion introduced solar cells and energy storage devices. Part of that discussion highlighted various solar cell shortcomings arising out of inefficiencies surrounding the storage of the energy they produce. Those shortcomings are addressed by embodiments of the invention that constitute an integration into a single device of the two types of structures that have been described above. An energy storage device—referred to now as an energy storage component because of its presence in the integrated structure—stores energy in the form of electrical charge produced from photons harvested and converted by a solar device, thereby improving the local storage capability of illuminated regions of the solar cell. For example, energy produced by the solar cell during sunny periods can be stored in the energy storage component and then released after dark (or when the solar cell is shaded by clouds or by trees) in order to maintain a more constant output voltage.

Energy storage devices (e.g., electrochemical capacitors) comprising porous electrodes fabricated in any suitable material (for example as set forth herein: silicon, germanium, carbon, etc.) can be monolithically fabricated as part of a solar cell, thereby enabling the device both to convert light into energy and to store the charge during brief or prolonged periods when the device is not exposed to light. As an example, the energy storage device can be fabricated onto the back side of a photovoltaic device. With the two devices fabricated on opposite sides of a substrate, an electrical connection can be achieved through the central bulk part of the substrate with charge carriers (electrons or holes) generated by the photovoltaic device.

Figure 5:
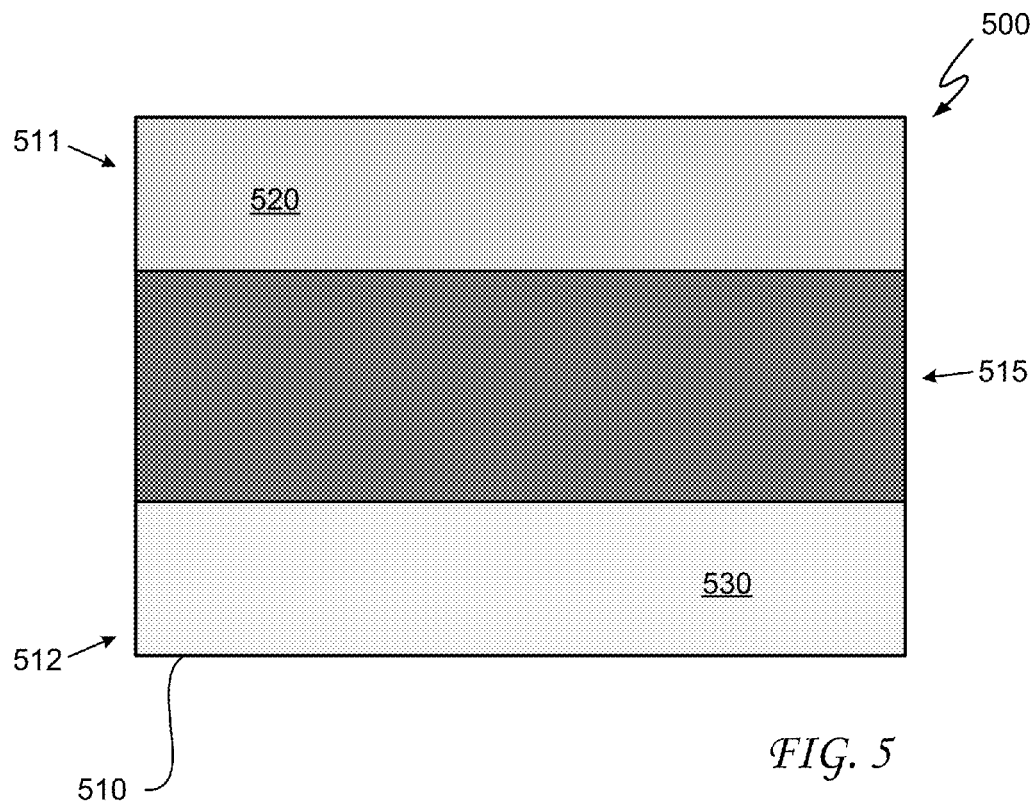
FIG. 5 is a schematic representation of an energy conversion and storage device according to an embodiment of the invention.

FIG. 5 is a schematic representation of an energy conversion and storage device 500 according to an embodiment of the invention. As illustrated in FIG. 5, energy conversion and storage device 500 comprises a semiconductive substrate 510 having a side 511, a side 512 opposite side 511, and a central bulk portion 515 between sides 511 and 512. A photovoltaic device 520 is fabricated at side 511 of the semiconductive substrate and an energy storage component 530 is fabricated at side 512 of the substrate. In an embodiment, the energy storage component comprises a porous semiconductive structure forming an interface with an electrolyte.

In an embodiment, the semiconductive structure comprises silicon. In an embodiment, the silicon acts as an absorber layer (either p-type or n-type), the energy storage component is a pseudocapacitor comprising a pseudocapacitive material (e.g., a solid state material such as $RuO_2$ or $MnO_2$), and the electrolyte comprises redox couples that are accessible at energies below a silicon band gap energy (e.g., metal redox couples such as $V^{2+/3+}$ and $Fe^{2+/3+}$). In another embodiment, the photovoltaic device comprises a p-n junction.

In various embodiments, the electrolyte is a liquid or a gel or a solid state electrolyte. In an embodiment, the photovoltaic device comprises an anti-reflective coating (e.g., a layer of dielectric material or a textured region on a surface of side 511 of semiconductive substrate 510).

Figure 6:
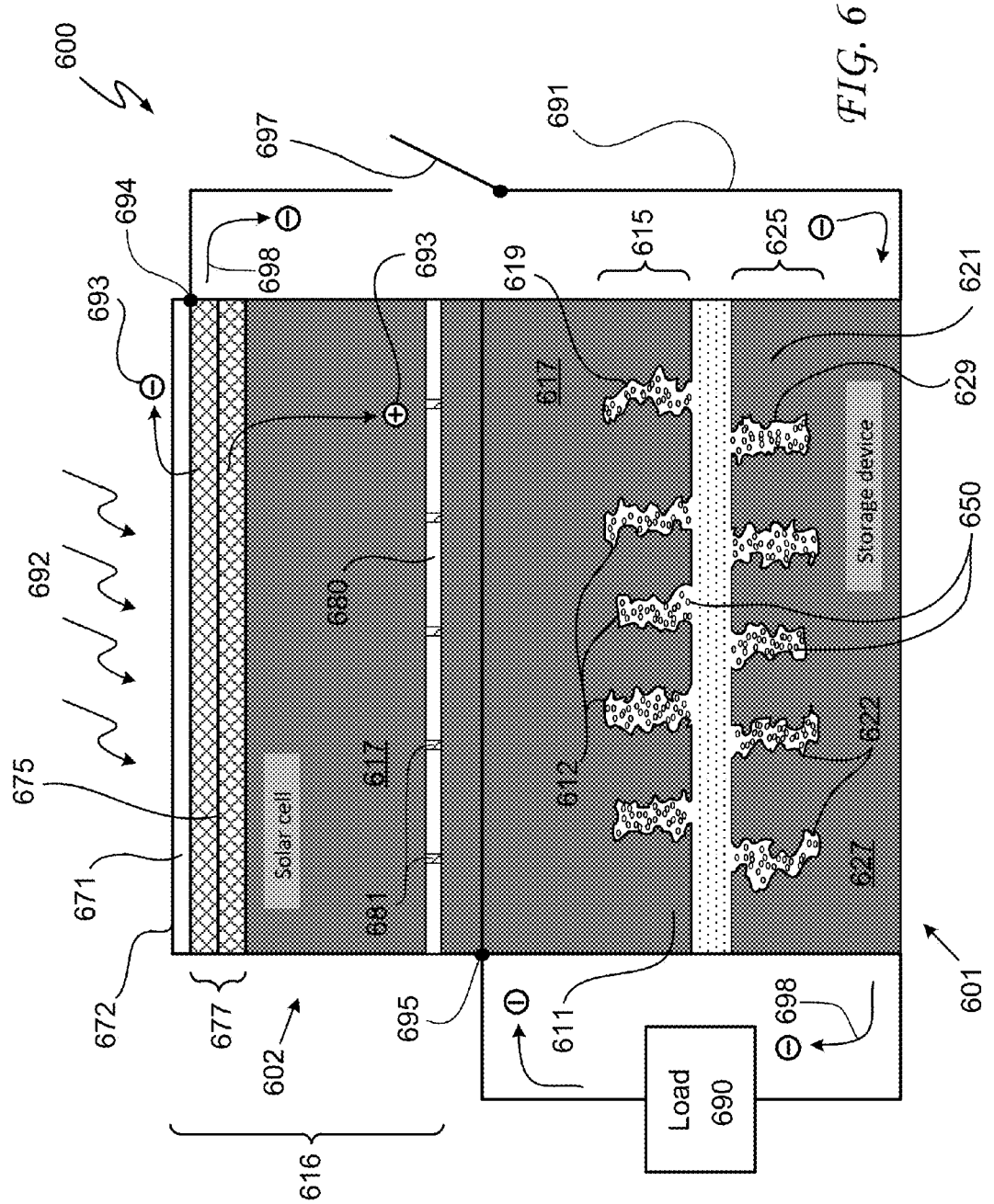
FIG. 6 is a cross-sectional view of an energy conversion and storage device according to an embodiment of the invention.

FIG. 6 is a cross-sectional view of an energy conversion and storage device 600 according to an embodiment of the invention. As an example, energy conversion and storage device 600 can be similar to energy conversion and storage device 500 that has just been described, and many components of energy conversion and storage device 600 that will be introduced below have corresponding components in energy conversion and storage device 500. As an example, FIG. 6 may be thought of as a more detailed illustration, according to an embodiment of the invention, of the generalized schematic of FIG. 5.

As illustrated in FIG. 6, energy conversion and storage device 600 comprises an energy storage component 601. In various embodiments, energy storage component 601 may take the form of a battery, a hybrid EC capacitor, a pseudocapacitor, or another energy storage device such as have been described above.

In various embodiments, energy storage component 601 may take the form of a battery, a hybrid EC capacitor, a pseudocapacitor, or another energy storage device such as have been described above. As an example, consider an embodiment where the energy storage component is a pseudocapacitor and material 617 is silicon. An external potential difference applied to the pseudocapacitor acts to reduce or oxidize either a solid-state material (e.g., $RuO_2$, $MnO_2$) or an electrolyte into a different valence state that can store the energy. Instead of utilizing a p-n junction to drive the separation of electron-hole pairs (which are then shuttled to an electrical circuit in a standard PV device), one could simply utilize the silicon as the absorbing layer (either p-type or n-type), and use an electrolyte that results in a built-in potential across the electrode-electrolyte interface. This potential can be utilized to drive redox reactions through the injection of minority carriers into the electrolyte or solid material located at the interface with the semiconductor absorber. The electrolytes in this system will have redox couples that are accessible at energies below the silicon band gap energy. This includes many of the metal redox couples such as $V^{2+/3+}$ and $Fe^{2+/3+}$, among others. Because Si is used as the porous material in this electrochemical storage system, one could integrate this design directly on the backside of a Si layer that acts as the absorber layer for a Si solar device. In this device, the system acts as a fully integrated conversion and storage system with the electrolyte/electrode interface driving the harvesting and storage reactions. This takes advantage of the fact that both devices are composed of the same material (which is silicon for the illustrated case but which could also be a variety of other materials as discussed herein).

In the illustrated embodiment, energy storage component 601 is an electrochemical capacitor that can be similar to energy storage device 101 that was first shown in FIG. 1. Accordingly, energy storage component 601 comprises an electrode 611 having a plurality of channels 612 formed in a region 615 of a material 617, and an electrode 621 having a plurality of channels 622 formed in a region 625 of a material 627. Electrode 621 is adjacent to but electrically isolated from electrode 611. An electrolyte 650 is located within channels 612 and 622 such that electrode 611 forms an interface 619 with the electrolyte and electrode 621 forms an interface 629 with the electrolyte.

Energy conversion and storage device 600 further comprises a photovoltaic component/solar cell 602 formed in a region 616 of material 617. Thus, in at least the illustrated embodiment, at least one electrode of the energy storage component is formed in the same material in which the photovoltaic component is formed. This architecture, therefore, represents a fully-integrated conversion and storage device that does not require the external wiring between energy conversion and energy storage components that a non-integrated system would require.

In the illustrated embodiment, PV component 602 comprises an anti-reflective coating 671 and a transparent electrically conductive layer 672. As an example, the transparent electrically conductive layer may enable electrical contact to the photoactive material in order to enable the charge to move through the external circuit and apply a voltage across the storage device while avoiding substantial losses. Other embodiments may include only one or the other of these components, and still other embodiments may omit both. For a bottom-illuminated device architecture, layer 672 (along with the rest of PV component 602) would be located on the bottom of device 600 and energy storage component 601 would move to the top. Anti-reflective coating 671 can be formed by creating a textured surface or by using a thin layer of dielectric material. The thickness of the dielectric material can be chosen such that interference effects cause the wave reflected from the anti-reflection coating to be out of phase with the wave reflected from the body of the PV component (i.e., from material 617).

Material 617 can have a thickness of, for example, at least 100 microns. In an embodiment, a photon-absorbing portion of PV component 602 constitutes an upper layer of material 617 beginning at a surface of the material and extending to a depth of no greater than 10 microns into the material.

Referring still to FIG. 6, in the general architecture shown, the solar cell can include either: (i) a p-n junction, where minority carriers are generated and then stored in the energy storage component; or (ii) a thin absorbing layer where electron-hole pairs diffuse to the electrode/electrolyte interface (e.g., interface 619) and minority carriers are injected into the electrolyte to drive electrochemical redox chemistry that stores the charge. Redox couples may be important in this regard, e.g., $Fe^{2+}/Fe^{3+}$, $V^{2+}/V^{3+}$, etc. Thus, in an embodiment, PV component 602 further comprises a p-n junction 675. In the illustrated embodiment, p-n junction 675 forms an interface within a depletion region 677 that is adjacent to anti-reflective coating 671.

In a non-illustrated embodiment, the p-n junction exists at the interface with the electrolyte in the porous electrode. In other words, the effective p-n junction of the solar device is the same interface that drives the energy storage, which is created by the junction between the porous material and the electrolyte. As electron-hole pairs are created by absorption in the material they diffuse to the material's surface. The built-in field at the liquid-semiconductor interface splits the electron and hole, and the minority carrier (which is either an electron or a hole, depending on the type of dopant in the material) drives an electrochemical reaction. One such configuration comprises a porous silicon piece, an electrolyte reservoir containing redox species, and a metal counter-electrode. In this configuration, the porous Si absorbs photons, and photo-excited electron-hole pairs diffuse to the interface between the porous silicon and the electrolyte, creating a depletion region. At the interface, the electron-hole pairs are split to drive a redox reaction. An integrated "redox battery" is thus created, where the charge is stored in a liquid.

A more complex device could be designed such that the liquid flows through the device and replenishes the electrolyte solution. This will inhibit the build-up of an excessive concentration of redox couples that have been "activated," and will allow the flow of activated redox species to a location in the device where they could be discharged. This would be a solar "flow battery."

In various embodiments, material 617 is a semiconductive material that can be made porous (e.g., using an etching technique as disclosed herein) and can also be made into a PV device. Such materials include monocrystalline silicon, polycrystalline silicon, amorphous silicon, germanium, gallium arsenide, cadmium telluride, copper indium selenide, copper indium gallium selenide, gallium indium phosphide, and copper indium sulfide, and in various embodiments, material 617 comprises at least one of these materials. Thus, for example, the material selected for the solar cell may be electrochemically etched in order to form channels for a porous electrode of the energy storage component.

Material 627 can be, but need not be, the same as material 617. In various embodiments, material 627 comprises at least one of monocrystalline silicon, polycrystalline silicon, amorphous silicon, carbon, other carbon-based materials, and nickel foam.

In an embodiment, energy conversion and storage device 600 comprises an electrically insulating layer 680 between energy storage component 601 and photovoltaic component 602. As an example, this can be a silicon-on-insulator (SOI)-like structure in which a layer of silicon dioxide (or another electrical insulator) is located at a desired depth below anti-reflective coating 671 (if present; otherwise, at a desired depth below a surface of PV component 602). The depth should be such that the insulating layer is located many times deeper than the minority carrier diffusion length ($L_D$) for the solar device. In other words, the thickness of the absorbing layer should be much greater than $L_D$. Circuitry can be designed on the device to connect the energy storage component as needed. In an embodiment, the electrical connection can be accomplished using through silicon vias (TSV) 681. It should be noted that the "TSV" designation used here is intended to cover any such connecting pathway, without regard for whether it is formed in or passes through silicon or some other material.

An energy conversion and storage device according to embodiments of the invention can be used as an energy source for a wide variety of devices that require energy, including mobile electronic devices and the like. Referring still to FIG. 6, such a device is represented by a load 690, which is connected to energy conversion and storage device 600 through circuitry 691. In operation, photons 692 (received from the sun or from some other suitable light source) impinge on PV component 602 and some of them are subsequently absorbed by material 617, thus generating an electron-hole pair 693 according to mechanisms known in the art that have previously been described herein. Contacts 694 and 695 are made to both the n-type and p-type sides of PV component 602, with load 690 situated between them. Charge carriers that are created on one side of the solar cell, or that have been swept there by the internal electric field, may travel through circuitry 691, pass into energy storage component 601 (where, depending on operating conditions, some or all of them may become "stored," that is, may contribute to the capacitance or other energy storage mechanism of the storage device) and/or may pass through the energy storage component in order to provide power to load 690, and then continue along the circuitry to contact 695, as indicated by arrows 698. Here they may recombine with a hole that was created on the other side of the solar cell or was swept across the junction from the first side after being created there. In an embodiment, contact 695 and/or contact 694 may comprise a multi-layer stack containing titanium, palladium, and silver. Contacts of other compositions are also possible, as known in the art. It should be understood that load 690 may be powered by energy that had previously been stored in energy storage component 601, by electricity flowing directly from PV component 602, or by some combination of energy from both sources.

A switch 697 operates to permit or to prevent the flow of charge carriers 693 through circuitry 691. In an embodiment, switch 697 closes when the voltage is high and opens when it is low. In other words, at times during which PV component 602 is receiving an amount of light 692 sufficient to generate electricity, switch 697 will close in order to allow charge carriers 693 to flow through circuitry 691 and be stored in energy storage component 601 and/or provide power to load 690. Conversely, during times when the number of impinging photons 692 are not sufficient to enable energy generation, switch 697 will open so as to prevent charge carriers from being drawn out of energy storage component 601 and back into PC component 602, where they would otherwise contribute to a possible undesired electroluminescence. Of course, if such electroluminescence is desired, the operation of switch 697 may be adjusted in order to enable it.

Figure 7:
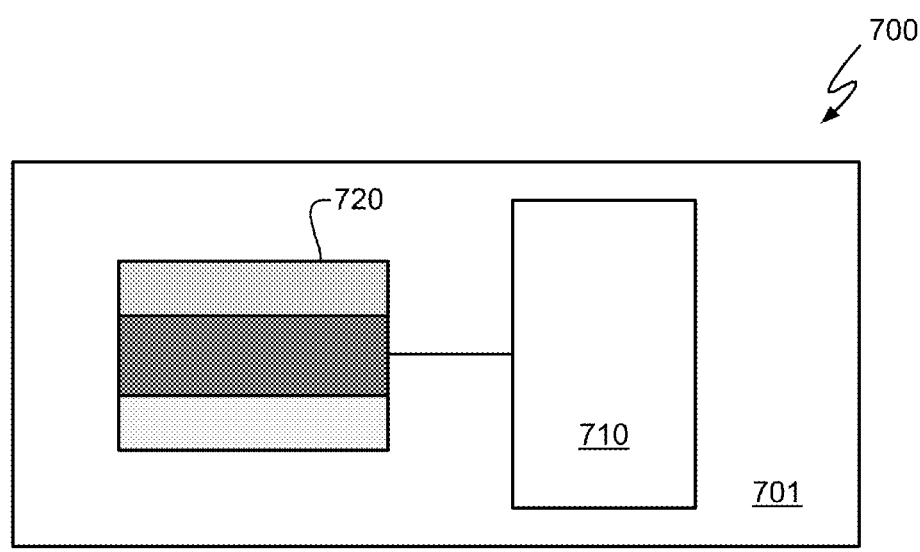
FIG. 7 is a schematic representation of a mobile electronic device incorporating an energy conversion and storage device according to an embodiment of the invention.

In one embodiment, an energy conversion and storage device like those described above can be used as part of a mobile electronic device such as a cell phone, a smart phone, a music player (or another hand-held computing system), a laptop, a nettop, a tablet (or another mobile computing system), a wristwatch, a calculator, or the like. FIG. 7 is a schematic representation of a mobile electronic device 700 according to an embodiment of the invention. As illustrated in FIG. 7, mobile electronic device 700 comprises a housing 701, a battery 710 contained within the housing, and an energy conversion and storage device 720 within housing 701 and connected to battery 710 so as to be capable of providing energy to the battery. In some embodiments, device 720 and/or battery 710 are further associated with an IC die (not shown) located inside housing 701, where being "associated with" the IC die can mean device 720 and/or battery 710 are integrated into the IC die or its packaging in some fashion (e.g., by being implemented on the die itself; by forming part of a Package-on-Package (PoP) architecture or a system-on-chip (SoC) architecture; etc.) As an example, energy conversion and storage device 720 can be similar to energy conversion and storage devices 500 and/or 600, described above and shown in FIGS. 5 and 6. It should be understood, however, that the depictions in the figures of energy storage devices 500 and 720 are potentially incomplete in that they omit certain details that would likely, or at least possibly, be present in a finished device. These potentially include one or more collectors attached to particular electrodes as well as various packaging components.

As an example, the connection between energy conversion and storage device 720 and battery 710 can include circuitry (not shown) including components such as a voltage converter, as would be apparent to one or ordinary skill in the art. Certain embodiments of mobile electronic device 700 do not require a battery because all of the energy required by the device is supplied by energy conversion and storage device 720. In those embodiments, battery 710 can be eliminated from the mobile electronic device.

The IC die may comprise any type of integrated circuit device. In one embodiment, the IC die includes a processing system (either single core or multi-core). For example, the IC die may comprise a microprocessor, a graphics processor, a signal processor, a network processor, a chipset, etc. In one embodiment, the IC die comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy conversion and storage device and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An energy conversion and storage device comprising:
   an energy storage component comprising:
      a first electrode comprising a first plurality of channels formed in a first region of a first material;
      a second electrode adjacent to but electrically isolated from the first electrode, the second electrode comprising a second plurality of channels formed in a first region of a second material; and
      an electrolyte within the first and second pluralities of channels such that the first electrode forms a first interface with the electrolyte and the second electrode forms a second interface with the electrolyte; and
   a photovoltaic component formed in a second region of the first material.

2. The energy conversion and storage device of claim 1 wherein:
   the photovoltaic component comprises one or both of an anti-reflective coating and a transparent electrically conductive layer.

3. The energy conversion and storage device of claim 1 wherein:
   the first material comprises at least one of monocrystalline silicon, polycrystalline silicon, amorphous silicon, germanium, gallium arsenide, cadmium telluride, copper indium selenide, copper indium gallium selenide, gallium indium phosphide, and copper indium sulfide.

4. The energy conversion and storage device of claim 1 wherein:
   the second material comprises at least one of monocrystalline silicon, polycrystalline silicon, amorphous silicon, carbon, carbon-based materials, and nickel foam.

5. The energy conversion and storage device of claim 1 wherein:
   the photovoltaic component comprises a p-n junction; and
   the p-n junction is the first interface with the electrolyte.

6. The energy conversion and storage device of claim 1 wherein:
   the photovoltaic component comprises a p-n junction; and
   the p-n junction constitutes a second interface separate from the first interface with the electrolyte.

7. The energy conversion and storage device of claim 6 further comprising:
   an electrically insulating layer between the energy storage component and the photovoltaic component.

8. The energy conversion and storage device of claim 7 wherein:
   the electrically insulating layer comprises silicon dioxide.

9. The energy conversion and storage device of claim 7 wherein:
   the energy storage component and the photovoltaic component are electrically connected using a through silicon via.

10. The energy conversion and storage device of claim 1 wherein:
    the first material has a thickness of at least 100 microns; and
    a photon-absorbing portion of the photovoltaic component constitutes an upper layer of the first material beginning at a surface of the first material and extending to a depth of no greater than 10 microns into the first material.

11. An energy conversion and storage device comprising:
    a semiconductive substrate having a first side, a second side opposite the first side, and a central bulk portion between the first side and the second side;
    a photovoltaic device fabricated at the first side of the semiconductive substrate; and
    an energy storage component at the second side of the semiconductive substrate, the energy storage component comprising a porous semiconductive structure forming an interface with an electrolyte.

12. The energy conversion and storage device of claim 11 further comprising:
    a transparent electrically conductive layer over the first side of the semiconductive substrate.

13. The energy conversion and storage device of claim 11 wherein:
    the photovoltaic device comprises a p-n junction.

14. The energy conversion and storage device of claim 11 wherein:
    the energy storage component is a pseudocapacitor comprising a pseudocapacitive material; and
    the electrolyte comprises redox couples that are accessible at energies below a silicon band gap energy.

15. The energy conversion and storage device of claim 14 wherein:
    the pseudocapacitive material is a solid-state material.

16. The energy conversion and storage device of claim 11 wherein:
    the anti-reflective coating comprises a layer of dielectric material.

17. The energy conversion and storage device of claim 11 wherein:
    the anti-reflective coating comprises a textured region on a surface of the first side of the semiconductive substrate.

18. A mobile electronic device comprising:
    a housing;
    a battery contained within the housing; and
    an energy conversion and storage device electrically connected to the battery, wherein the energy conversion and storage device comprises:
        a semiconductive substrate having a first side, a second side opposite the first side, and a central bulk portion between the first side and the second side;
        a photovoltaic device fabricated at the first side of the semiconductive substrate, the photovoltaic device comprising an anti-reflective coating; and
        an energy storage component at the second side of the semiconductive substrate, the energy storage component comprising a porous silicon structure forming an interface with an electrolyte.

19. The mobile electronic device of claim 18 wherein:
    the photovoltaic device further comprises a p-n junction.

* * * * *